(12) United States Patent
Jin et al.

(10) Patent No.: US 12,278,301 B2
(45) Date of Patent: Apr. 15, 2025

(54) PHOTOVOLTAIC CELL AND PHOTOVOLTAIC MODULE

(71) Applicants: ZHEJIANG JINKO SOLAR CO., LTD., Zhejiang (CN); JINKO SOLAR CO., LTD., Jiangxi (CN)

(72) Inventors: Jingsheng Jin, Zhejiang (CN); Nannan Yang, Zhejiang (CN); Lin'an Zhang, Zhejiang (CN); Guangming Liao, Zhejiang (CN); Xinyu Zhang, Zhejiang (CN)

(73) Assignees: ZHEJIANG JINKO SOLAR CO., LTD., Zhejiang (CN); JINKO SOLAR CO., LTD., Jiangxi (CN)

( * ) Notice: Subject to any disclaimer, the term of this patent is extended or adjusted under 35 U.S.C. 154(b) by 0 days.

(21) Appl. No.: 17/852,298

(22) Filed: Jun. 28, 2022

(65) Prior Publication Data
US 2023/0327034 A1    Oct. 12, 2023

(30) Foreign Application Priority Data
Apr. 11, 2022 (CN) .......................... 202210377280.2

(51) Int. Cl.
*H01L 31/05*    (2014.01)
*H01L 31/0236*    (2006.01)
*H01L 31/068*    (2012.01)

(52) U.S. Cl.
CPC .... *H01L 31/0504* (2013.01); *H01L 31/02363* (2013.01); *H01L 31/068* (2013.01)

(58) Field of Classification Search
CPC ........... H01L 31/0504; H01L 31/02363; H01L 31/068
See application file for complete search history.

(56) References Cited

U.S. PATENT DOCUMENTS 6,114,046 A * 9/2000 Hanoka .................. H01L 31/048
156/99
6,300,558 B1 * 10/2001 Takamoto ........... H01L 31/0735
136/261

(Continued)

FOREIGN PATENT DOCUMENTS

CN    108987505 A    12/2018
CN    109285897 A    1/2019

(Continued)

OTHER PUBLICATIONS

Machine translation—WO2019021545A1 (Year: 2019).*

(Continued)

*Primary Examiner* — Tamir Ayad
(74) *Attorney, Agent, or Firm* — USCH Law, PC

(57) ABSTRACT

A photovoltaic cell is provided, which includes: a substrate; a tunnel oxide layer and a doping conductive layer sequentially disposed on a first surface of the substrate in a direction away from the substrate, wherein the tunnel oxide layer includes nitrogen and phosphorus; a doping surface field disposed in the substrate, wherein the doping surface field is in contact with a side of the tunnel oxide layer facing the substrate, the doping surface field includes a doping element of a same conductivity type as a doping element in the substrate, and a doping concentration on a side of the doping surface field facing the tunnel oxide layer is greater than a doping concentration on a side of the doping surface field away from the tunnel oxide layer; and a metal electrode electrically connected to the doping conductive layer.

17 Claims, 4 Drawing Sheets

(56) References Cited

U.S. PATENT DOCUMENTS

| | | | |
|---|---|---|---|
| 11,621,359 B1 | 4/2023 | Jin et al. | |
| 11,862,741 B2 | 1/2024 | Jin et al. | |
| 2011/0290318 A1* | 12/2011 | Engelhart | H01L 31/02167 |
| | | | 136/256 |
| 2014/0096817 A1 | 4/2014 | Xie et al. | |
| 2016/0126394 A1* | 5/2016 | Romijn | H01L 31/1804 |
| | | | 438/71 |
| 2017/0213921 A1* | 7/2017 | Yang | H01L 31/022441 |
| 2022/0059718 A1 | 2/2022 | Yuan et al. | |
| 2022/0102568 A1 | 3/2022 | Yang et al. | |
| 2022/0271179 A1 | 8/2022 | Li et al. | |

FOREIGN PATENT DOCUMENTS

| | | | | |
|---|---|---|---|---|
| CN | 208797020 U | | 4/2019 | |
| CN | 110098280 A | | 8/2019 | |
| CN | 110352501 A | | 10/2019 | |
| CN | 209471975 U | | 10/2019 | |
| CN | 110634971 A | | 12/2019 | |
| CN | 210805782 U | | 6/2020 | |
| CN | 111524983 A | | 8/2020 | |
| CN | 211182223 U | | 8/2020 | |
| CN | 112186067 A | * | 1/2021 | ....... H01L 31/02168 |
| CN | 112331742 A | | 2/2021 | |
| CN | 112542521 A | | 3/2021 | |
| CN | 113078232 A | | 7/2021 | |
| CN | 214043687 U | | 8/2021 | |
| CN | 113488384 A | | 10/2021 | |
| CN | 113594304 A | | 11/2021 | |
| CN | 113921626 A | | 1/2022 | |
| CN | 113964212 A | | 1/2022 | |
| CN | 113964216 A | | 1/2022 | |
| CN | 113964212 B | | 3/2022 | |
| CN | 114242803 A | | 3/2022 | |
| EP | 2787541 A1 | | 10/2014 | |
| JP | 2009515336 A | | 4/2009 | |
| JP | 2011003877 A | | 1/2011 | |
| JP | 2011517119 A | | 5/2011 | |
| JP | 2011233875 A | | 11/2011 | |
| JP | 5019397 B2 | | 9/2012 | |
| JP | 2013524514 A | | 6/2013 | |
| JP | 2014204128 A | | 10/2014 | |
| JP | 2014239150 A | | 12/2014 | |
| JP | 2015056493 A | | 3/2015 | |
| JP | 2015207707 A | | 11/2015 | |
| JP | 2016501451 A | | 1/2016 | |
| JP | 5991945 B2 | | 9/2016 | |
| JP | 2017017323 A | | 1/2017 | |
| JP | 2017050402 A | | 3/2017 | |
| JP | 2017526164 A | | 9/2017 | |
| JP | 6975368 B1 | | 12/2021 | |
| KR | 20140143279 A | | 12/2014 | |
| WO | 2017145633 A1 | | 8/2017 | |
| WO | WO-2017163498 A1 | * | 9/2017 | ......... H01L 31/0216 |
| WO | 2019021545 A1 | | 1/2019 | |

OTHER PUBLICATIONS

Machine translation of WO 2017163498-A1 (Year: 2017).*
Machine translation of CN112186067 (Year: 2021).*
Zhejiang Jinko Solar Co., Ltd. et al., Extended European Search Report, EP 22181370.2, Nov. 24, 2022, 8 pgs.
Zhejiang Jinko Solar Co., Ltd. et al., Notice of Allowance, U.S. Appl. No. 17/845,993, Jan. 26, 2023, 9 pgs.
Zhejiang Jinko Solar Co., Ltd. et al., Extended European Search Report, EP 22179720.2, Dec. 20, 2022, 4 pgs.
Zhejiang Jinko Solar Co., Ltd. et al., JP First Office Action with English translation, JP 2022-108833, Jul. 28, 2022, 4 pgs.
Zhejiang Jinko Solar Co., Ltd. et al., JP Decision to Grant with English translation, JP 2022-108833, Sep. 5, 2022, 5 pgs.
Zhejiang Jinko Solar Co., Ltd., et al., AU First Office Action, AU 2022204646, Jul. 6, 2023, 8 pgs.
Zhejiang Jinko Solar Co., Ltd., et al., JP Notice of Reasons for Refusal with English translation, JP 2023-083541, Apr. 26, 2024, 14 pgs.
Zhejiang Jinko Solar Co., Ltd., et al., Non-Final Rejection, U.S. Appl. No. 18/493,596, May 23, 2024, 22 pgs.
Zhejiang Jinko Solar Co., Ltd., et al., Extended European Search Report, EP 24156165.3, May 28, 2024, 10 pgs.

* cited by examiner

PHOTOVOLTAIC CELL AND PHOTOVOLTAIC MODULE

CROSS-REFERENCE TO RELATED APPLICATION

The present application claims the benefit of priority under the Paris Convention to Chinese Patent Application No. 202210377280.2 filed on Apr. 11, 2022, which is incorporated herein by reference in its entirety.

TECHNIC FIELD

Embodiments of the present disclosure relate in general to a photovoltaic cell, and more specifically to a photovoltaic cell, a method for manufacturing the photovoltaic cell and a photovoltaic module.

BACKGROUND

The photovoltaic cell has good photoelectric conversion capability. Generally, a tunnel oxide layer and a doping conductive layer are disposed on a surface of a substrate to suppress recombination of carriers on the surface of the substrate in the photovoltaic cell and enhance passivation effect on the substrate. The tunnel oxide layer has good chemical passivation effect, and the doping conductive layer has good field passivation effect. In addition, in order to transmit and collect photogenerated carriers generated by the photovoltaic cell, electrodes are also disposed on a portion of the surface of the substrate.

However, conventional photovoltaic cells have low reliability.

SUMMARY

Some embodiments of the present disclosure provide a photovoltaic cell, a method for manufacturing the photovoltaic cell, and a photovoltaic module, which is at least conducive to reducing series resistance of the photovoltaic cell.

Some embodiments of the present disclosure provide a photovoltaic cell including: a substrate; a tunnel oxide layer and a doping conductive layer sequentially disposed on a first surface of the substrate in a direction away from the substrate, where the tunnel oxide layer includes nitrogen and phosphorus; a doping surface field disposed in the substrate, where the doping surface field is in contact with a side of the tunnel oxide layer facing the substrate, the doping surface field includes a doping element of a same conductivity type as a doping element included in the substrate, and a doping concentration on a side of the doping surface field facing the tunnel oxide layer is greater than a doping concentration on a side of the doping surface field away from the tunnel oxide layer; and a metal electrode electrically connected to the doping conductive layer.

In some embodiments, the substrate includes a first region, where the first region includes a region of the substrate except for the doping surface field, a doping concentration of the doping surface field is greater than a doping concentration of the first region, and the doping concentration of the doping surface field is less than a doping concentration of the doping conductive layer.

In some embodiments, a ratio of the doping concentration of the first region to the doping concentration of the doping surface field is in a range of 1:10000 to 1:1000.

In some embodiments, a ratio of the doping concentration of the doping surface field to the doping concentration of the doping conductive layer is in a range of 1:100 to 1:10.

In some embodiments, a ratio of the doping concentration on the side of the doping surface field away from the tunnel oxide layer to the doping concentration on the side of the doping surface field facing the tunnel oxide layer is in a range of 1:1000 to 1:10.

In some embodiments, a doping concentration of the doping surface field gradually decreases in a direction along the tunnel oxide layer toward the substrate.

In some embodiments, a thickness of the doping surface field is in a range of 20 nm to 60 nm in a direction from the tunnel oxide layer toward the substrate.

In some embodiments, at least a portion of the metal electrode penetrates the tunnel oxide layer and is coated by the doping surface field.

In some embodiments, at least a portion of the substrate corresponding to the metal electrode penetrates the tunnel oxide layer, and the doping surface field disposed in the substrate penetrating the tunnel oxide layer is in contact with the metal electrode.

In some embodiments, a surface of the doping surface field in contact with the metal electrode includes a concave-convex surface.

In some embodiments, a width of the concave-convex surface is less than a width of the metal electrode.

Some embodiments of the present disclosure further provide a photovoltaic module including: a cell string including a plurality of photovoltaic cells electrically connected, where each of the plurality of photovoltaic cells includes the photovoltaic cell according to the above embodiments; an encapsulation layer configured to cover a surface of the cell string; and a cover plate configured to cover a surface of the encapsulation layer away from the cell string.

Some embodiments of the present disclosure further provide a method for manufacturing a photovoltaic cell including: providing a substrate; sequentially forming a tunnel oxide layer and a doping conductive layer on a first surface of the substrate in a direction away from the substrate, where the tunnel oxide layer includes nitrogen and phosphorus; forming a doping surface field in the substrate, where the doping surface field is in contact with a side of the tunnel oxide layer facing the substrate, the doping surface field includes a doping element of a same conductivity type as a doping element included in the substrate, and a doping concentration on a side of the doping surface field facing the tunnel oxide layer is greater than a doping concentration on a side of the doping surface field away from the tunnel oxide layer; and forming a metal electrode electrically connected to the doping conductive layer.

In some embodiments, the doping surface field is formed before forming the tunnel oxide layer and the doping conductive layer, and forming the doping surface field includes: doping the substrate, where the substrate has first doping ions; and performing a diffusion treatment on a first surface of the substrate to form the doping surface field, where the doping surface field has second doping ions, the first doping ions have a same conductivity type as the second doping ions, and a doping concentration of the first doping ions is less than a doping concentration of the second doping ions.

In some embodiments, the doping concentration of the first doping ions is in a range of $1 \times 10^{16}$ atoms/cm$^3$ to $1 \times 10^{17}$ atoms/cm$^3$, and the doping concentration of the second doping ions is in a range of $1 \times 10^{19}$ atoms/cm$^3$ to $9 \times 10^{20}$ atoms/cm$^3$.

In some embodiments, the tunnel oxide layer and the doping conductive layer are formed after forming the doping surface field, and forming the tunnel oxide layer and the doping conductive layer includes: forming the tunnel oxide layer on a surface of the doping surface field by an oxidation treatment; depositing an initial conductive layer on a surface of the tunnel oxide layer; and performing a diffusion treatment on the initial conductive layer to form the doping conductive layer, where the doping conductive layer has third doping ions, the third doping ions have a same conductivity type as the second doping ions, and a doping concentration of the third doping ions is greater than the doping concentration of the second doping ions.

In some embodiments, the doping concentration of the third doping ions is in a range of 1 atoms/cm$^3$ to $1\times10^{20}$ atoms/cm$^3$.

In some embodiments, forming the tunnel oxide layer including nitrogen and phosphorus includes: performing thermal oxidation on the first surface of the substrate to form an initial oxide layer; performing phosphorus diffusion on the initial oxide layer to form a first oxide layer including phosphorus; and performing nitrogen doping on the first oxide layer to form the tunnel oxide layer.

BRIEF DESCRIPTION OF THE DRAWINGS

One or more embodiments are described as examples with reference to the corresponding figures in the accompanying drawings, and the examples do not constitute a limitation to the embodiments. The figures in the accompanying drawings do not constitute a proportion limitation unless otherwise stated.

DETAILED DESCRIPTION OF THE EMBODIMENTS

Figure 1:
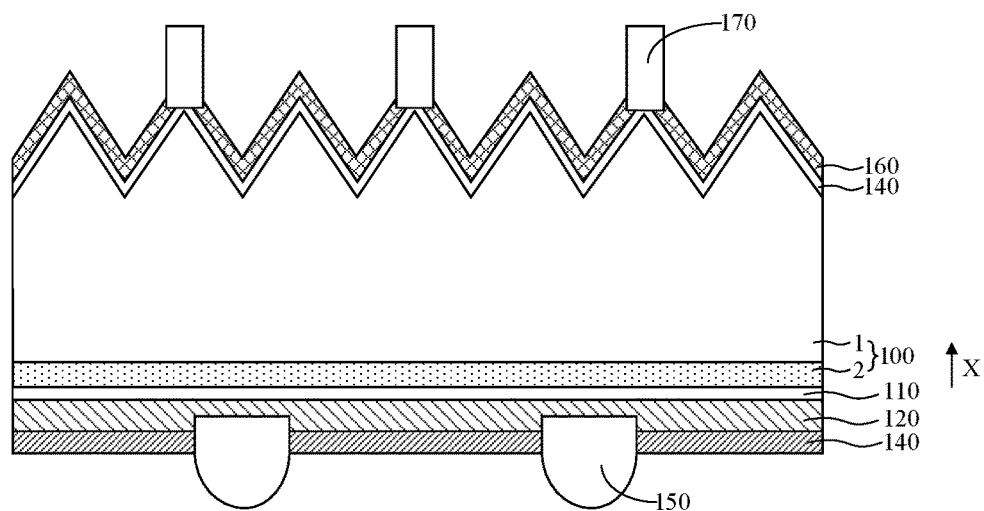
FIG. 1 is a schematic structural diagram of a photovoltaic cell according to an embodiment of the present disclosure.

It is known from the background that the conventional photovoltaic cells have low reliability.

One of reasons for the low reliability of the photovoltaic cell is as follows. A tunnel oxide layer and a doping conductive layer are provided on a rear surface of a substrate in the process of manufacturing the photovoltaic cell, and the tunnel oxide layer has a good interface passivation effect. Meanwhile, a metal electrode needs to be provided on the rear surface of the substrate. Generally, the metal electrode does not penetrate the tunnel oxide layer, but is in contact with the doping conductive layer to maintain the good passivation effect of the tunnel oxide layer. However, due to the manufacturing process, the metal electrode may partially penetrate the tunnel oxide layer and directly contact the substrate, resulting in serious recombination at the interface between the metal electrode and the substrate, so that an open circuit voltage and efficiency of the cell are reduced, thereby reducing the reliability of the photovoltaic cell.

Embodiments of the present disclosure provides a photovoltaic cell in which a tunnel oxide layer includes nitrogen and phosphorus, so as to improve an overall passivation effect of the tunnel oxide layer. Even if a metal electrode penetrates the tunnel oxide layer, the penetrated tunnel oxide layer is able to meet a passivation requirement of a substrate. A doping surface field is disposed in the substrate, and the doping surface field is in contact with a side of the tunnel oxide layer facing the substrate, and the doping surface field is configured to include a doping element of the same conductivity type as a doping element included in the substrate, so that lateral transmission of most carriers is enhanced, and a series resistance of the cell is reduced. In this way, even if the metal electrode penetrates the tunnel oxide layer and is in direct contact with the substrate, the doping surface field disposed in the substrate is still able to coat the metal electrode, thereby having a good interface passivation effect on the metal electrode disposed in the substrate, and reducing interface recombination between the metal electrode and the substrate. Furthermore, a doping concentration on a side of the doping surface field facing the tunnel oxide layer is configured to be greater than a doping concentration on a side of the doping surface field away from the tunnel oxide layer, i.e., a doping concentration difference is provided in the doping surface field, so that the carriers transmitted through the metal electrode is able to be smoothly transmitted into the substrate, thereby increasing transmission efficiency of the carriers. Therefore, even if the metal electrode penetrates the tunnel oxide layer to the substrate, the photovoltaic cell is still able to maintain the good performance, thereby improving the reliability of the photovoltaic cell.

Various embodiments of the present disclosure will be described in detail below with reference to the accompanying drawings. However, those of ordinary skill in the art should appreciate that many technical details have been proposed in various embodiments of the present disclosure for better understanding of the present disclosure. The technical solutions claimed in the present disclosure is able to be realized even without these technical details as well as various changes and modifications based on the following embodiments.

FIG. 1 is a schematic structural diagram of a photovoltaic cell according to an embodiment of the present disclosure.

Referring to FIG. 1, the photovoltaic cell includes a substrate 100, a tunnel oxide layer 110 and a doping conductive layer 120 sequentially disposed on a first surface of the substrate 100 in a direction away from the substrate 100, a doping surface field 2 disposed in the substrate, and a metal electrode 150. The tunnel oxide layer 110 includes nitrogen and phosphorus. The doping surface field 2 is in contact with a side of the tunnel oxide layer 110 facing the substrate 100, the doping surface field 2 includes a doping element of the same conductivity type as a doping element included in the substrate, and a doping concentration of the doping surface field 2 facing the tunnel oxide layer 110 is greater than a doping concentration of the doping surface field 2 away from the tunnel oxide layer 110. The metal electrode 150 is electrically connected to the doping conductive layer 120.

The substrate 100 is configured to receive incident light and generate photogenerated carriers. In some embodiments, the substrate 100 may be a silicon substrate 100, and a material of the silicon substrate 100 may include at least one of single crystal silicon, polysilicon, amorphous silicon, or microcrystalline silicon. In some embodiments, a material of the substrate 100 may also include at least one of elemental carbon, an organic material, or a multinary-compound. The multinary-compound includes gallium arsenide, cadmium telluride, copper indium selenium, etc.

In some embodiments, the photovoltaic cell is a tunnel oxide passivated contact (TOPCON) cell, the substrate 100 further includes a second surface opposite the first surface, and both the first surface and the second surface of the substrate 100 may be configured to receive incident or reflected light. In some embodiments, the second surface of the substrate 100 may be provided as a pyramid pile surface such that the second surface of the substrate 100 has a low reflectivity to incident light and thus having a high absorption utilization rate of the light. The first surface of the substrate 100 may be provided as a non-pyramid pile surface, such as an approximately laminated step profile, so that the tunnel oxide layer 110 disposed on the first surface of the substrate 100 has a high degree of density and uniformity such that the tunnel oxide layer 110 has a good passivation effect on the first surface of the substrate 100. In some embodiments, the first surface may be a rear surface of the substrate 100, and the second surface may be a front surface of the substrate 100. In some embodiments, the first surface may be the front surface of the substrate 100, and the second surface may be the rear surface of the substrate 100.

In some embodiments, the substrate 100 is an N-type semiconductor substrate 100, i.e., the substrate 100 is doped with N-type doping ions, which may be any of phosphorus ions, arsenic ions, or antimony ions. The second surface of the substrate 100 has an emitter, which may be a P-type doping layer doped with P-type doping ions, and the emitter and the substrate 100 forms a PN junction of the photovoltaic cell. In some embodiments, the emitter may be obtained by diffusion doping on the surface of the substrate 100 with P-type doping ions, and the doped portion of the substrate 100 is converted to the emitter. Specifically, in some embodiments, the P-type doping ions may be boron ions.

The tunnel oxide layer 110 and the doping conductive layer 120 may serve as passivation contact layers to effectively reduce interface recombination and metal contact recombination of the substrate 100. Meanwhile, the doping conductive layer 120 is in ohmic contact with the metal electrode 150. While the metal electrode 150 collects and transmits carriers for the substrate 100, the good interface passivation effect of the tunnel oxide layer 110 on the substrate 100 is maintained. Specifically, a dangling bond on the surface of the substrate 100 is saturated to reduce an interface defect state density of the surface of the substrate 100, thereby reducing a recombination rate of carriers by reducing recombination centers of the surface of the substrate 100.

However, when the metal electrode 150 penetrates the tunnel oxide layer 110, a structure of the tunnel oxide layer 110 is destroyed, so that a contact area between the tunnel oxide layer 110 and the first surface of the substrate 100 is reduced, thereby greatly weakening the interface passivation effect of the tunnel oxide layer 110. Based on the above considerations, in the embodiments of the present disclosure, nitrogen and phosphorus are added to the tunnel oxide layer 110 to improve the passivation effect of the tunnel oxide layer 110, so that the tunnel oxide layer 110 is still able to meet the interface passivation requirement of the substrate 100 after the metal electrode 150 penetrates the tunnel oxide layer 110. Specifically, through the nitrogen doping, a dielectric constant at the interface of the tunnel oxide layer 110 is able to be increased, thereby improving the passivation effect. Considering that an internal resistance of the photovoltaic cell may be increased after the nitrogen doping, phosphorus is also doped in the tunnel oxide layer 110 to generate a donor impurity level near a conduction band in a band gap of the tunnel oxide layer 110 so as to increase a tunneling current of the carriers, thereby reducing the series resistance. That is, through the co-doping of nitrogen and phosphorus, the passivation effect of the tunnel oxide layer 110 is able to be improved without increasing the series resistance of the photovoltaic cell.

In some embodiments, a material of the tunnel oxide layer 110 may be silicon oxide. After the nitrogen doping, silicon oxide is converted into $SiO_xN_y$, and the content of nitrogen needs to be properly configured to maintain the good passivation performance of the tunnel oxide layer 110. Because, as the content of nitrogen increases, the interface of the nitrogen-doped silicon oxide layer converts from Si—$SiO_x$ to Si—$SiN_y$, and a lattice constant and a thermal expansion coefficient of $SiN_y$ has better adaptation to silicon, resulting in formation of more defects in the nitrogen-doped silicon oxide layer. Based on this, y/x+y<15% is provided, and in this range, a gold content of nitrogen is able to prevent more defects from forming in the tunnel oxide layer 110, thereby increasing a mobility rate of carriers. It should be noted that x represents the content of oxygen, and y represents the content of nitrogen.

In some embodiments, a doping concentration of phosphorus in the tunnel oxide layer 110 may be in a range of $1\times10^{10}/cm^3$ to $1\times10^{18}/cm^3$, for example, $1\times10^{10}/cm^3$, $1\times10^{11}/cm^3$, $1\times10^{12}/cm^3$, $1\times10^{13}/cm^3$, $1\times10^{14}/cm^3$, $1\times10^{15}/cm^3$, $1\times10^{16}/cm^3$, $1\times10^{17}/cm^3$, $1\times10^{18}/cm^3$, etc. In this range of the doping concentration, phosphorus in the tunnel oxide layer 110 is able to avoid or reduce the generation of impurity defects in the tunnel oxide layer 110, thereby ensuring that the carriers transmitted in the tunnel oxide layer 110 have a large tunneling current.

A doping concentration on a side of the doping surface field 2 facing the tunnel oxide layer 110 is configured to be greater than a doping concentration on a side of the doping surface field 2 away from the tunnel oxide layer 110, i.e., a doping concentration difference is provided in the doping surface field 2 so that when the metal electrode 150 penetrates the tunnel oxide layer 110 and is coated by the doping surface field 2, carriers transmitted through the metal electrode 150 is able to be smoothly transmitted into the substrate 100 due to the presence of the concentration difference, thereby further improving the passivation effect of the doping surface field 2 on the metal electrode 150. Specifically, in some embodiments, a ratio of the doping concentration on the side of the doping surface field 2 away from the tunnel oxide layer to the doping concentration on the side of the doping surface field 2 facing the tunnel oxide layer is in a range of 1:1000 to 1:10, for example, 1:1000 to 1:800, 1:800 to 1:500, 1:600 to 1:300, 1:1000 to 1:100, 1:1000 to 1:50, 1:1000 to 1:10, etc. In this range, the doping concentration on the side of the doping surface field 2 facing the tunnel oxide layer 110 is high, so that an overall doping concentration of the doping surface field 2 is much higher than a doping concentration of a region of the substrate 100 except for the doping surface field 2, so that the doping surface field 2 forms a heavily doped region relative to the other region of the substrate 100, thereby forming a high-low junction with a first region of the substrate 100. On the one hand, a lateral transmission rate of the carriers is improved and the series resistance of the photovoltaic cell is reduced. On the other hand, when the metal electrode 150 penetrates the tunnel oxide layer 110 to the substrate 100, the doping surface field 2 has a good passivation effect on the metal electrode 150, thereby reducing the recombination of carriers at the interface between the substrate 100 and the metal electrode 150 and increasing the open circuit voltage of the photovoltaic cell.

In some embodiments, the doping concentration of the doping surface field 2 may gradually decrease in a direction along the tunnel oxide layer 110 toward the substrate 100, so that a concentration difference is formed between each portion of the doping surface field 2 and an adjacent region in the direction along the tunnel oxide layer 110 toward the substrate 100, so that each portion of the doping surface field 2 has a good transmission effect on carriers and further increases a transmission rate of the carriers.

In some embodiments, the substrate 100 includes a first region 1. The first region 1 includes a region of the substrate 100 except for the doping surface field 2, a doping concentration of the doping surface field 2 is greater than a doping concentration of the first region 1, and the doping concentration of the doping surface field 2 is less than a doping concentration of the doping conductive layer 120.

The doping concentration of the doping surface field 2 is configured to be greater than the doping concentration of the first region 100 of the substrate 100, so that the doping surface field 2 in the substrate 100 forms a heavily doped region. The heavily doped region forms a high-low junction with the first region 1 of the substrate 100. When the metal electrode 150 penetrates the tunnel oxide layer 110, the doping surface field 2 coats the metal electrode 150 and has a passivate effect on the interface between the metal electrode 150 and the substrate 100, thereby reducing recombination of carriers at the interface and increasing the concentration of the carriers. Furthermore, the doping surface field 2 may form an ohmic contact with the metal electrode 150, thereby further reducing the series resistance of the photovoltaic cell. Specifically, in some embodiments, when the substrate 100 is an N-type semiconductor substrate 100, doping ions of the doping surface field 2 may be any of phosphorus ions, arsenic ions, or antimony ions. Specifically, in some embodiments, a ratio of the doping concentration of the first region 1 to the doping concentration of the doping surface field 2 may be in a range of 1:10000 to 1:1000, for example, 1:10000 to 1:8000, 1:8000 to 1:5000, 1:5000 to 1:3000, 1:3000 to 1:1000, etc. In this range, the doping concentration difference between the doping surface field 2 and the substrate 100 is large, so that the high-low junction is able to be formed, which is conducive to reducing the recombination of the carriers at the interface between the metal electrode 150 and the substrate 100, thereby enhancing the transmission capability of the carriers.

In some embodiments, the doping surface field 2 and the doping conductive layer 120 have the same conductivity type of doping ions. In some embodiments, when the doping ions of the doping surface field 2 are N-type doping ions, the doping ions in the doping conductive layer 120 may be any of phosphorus ions, arsenic ions, or antimony ions. The doping concentration of the doping surface field 2 is configured to be less than the doping concentration of the doping conductive layer 120, so that a concentration difference from high to low is formed in a direction along the doping conductive field 2 toward the substrate 100. Since the doping conductive layer 120 also plays the role of transmitting the carriers, the carrier concentration of the doping conductive layer 120 is configured to be high, which facilitates the carriers in the doping conductive layer 120 to be transmitted from the doping conductive layer 120 with higher doping concentration to the doping surface field 2 with lower doping concentration, thereby accelerating the transmission rate of the carriers and increasing the open circuit voltage of the photovoltaic cell.

Considering that the doping concentration of the doping conductive layer 120 needs to be kept high so as to maintain the capability of the doping conductive layer 120 to transmit carriers, and further considering that the doping concentration of the doping surface field 2 needs to be high to form a large concentration difference between the doping surface field 2 and the first region 1 of the substrate 100 so as to form a heavily doped region. Based on this, in some embodiments, a ratio of the doping concentration of the doping surface field 2 to the doping concentration of the doping conductive layer 120 may be in a range of 1:100 to 1:10, for example, 1:100 to 1:80, 1:80 to 1:60, 1:60 to 1:40, 1:40 to 1:20, 1:20 to 1:10, etc. In this range, the doping conductive layer 120 has a high carrier transmission rate, while the doping surface field 2 has a good passivation effect on the interface between the metal electrode 150 and the substrate 100.

In some embodiments, a thickness of the doping surface field 2 is in a range of 20 nm to 60 nm in a direction from the tunnel oxide layer 110 toward the substrate 100 (referring to the direction 'X' in the figures). In this range, on the one hand, the thickness of the doping surface field 150 is large, so that even if the metal electrode 150 of a larger length penetrates through the tunnel oxide layer 110, the doping surface field 2 is able to coats the metal electrode 150 so as to have a good interface passivation effect on the metal electrode 150 disposed in the substrate 100, and further improve the reliability of the photovoltaic cell, thereby enlarging a process window for manufacturing the metal electrode 150. On the other hand, since the doping surface field 2 is formed in the substrate 100, the thickness of the doping surface field 2 is not excessively large in this range, so that a size of the substrate 100 is not excessively large, which is conducive to miniaturization of the photovoltaic cell.

Figure 2:
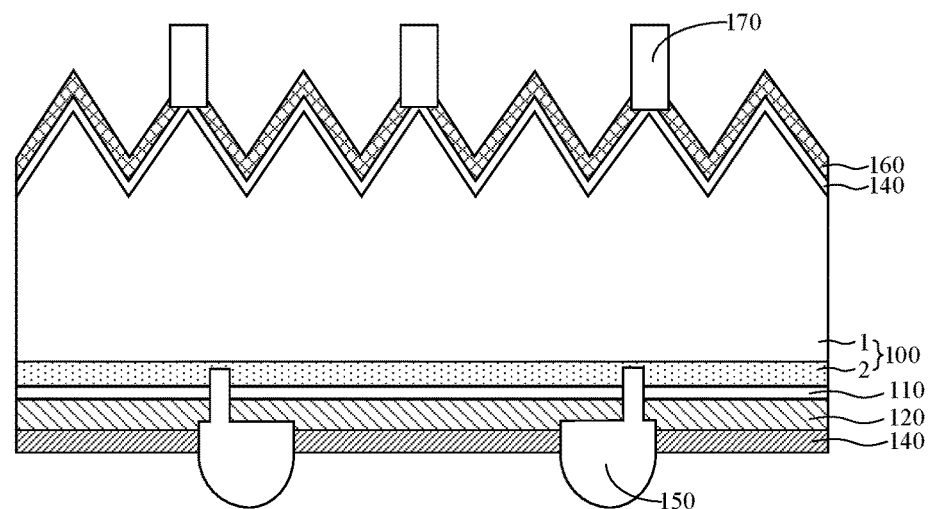
FIG. 2 is another schematic structural diagram of a photovoltaic cell according to an embodiment of the present disclosure.

FIG. 2 is another schematic structural diagram of a photovoltaic cell according to an embodiment of the present disclosure. Referring to FIG. 2, in some embodiments, at least a portion of the metal electrode 150 penetrates the tunnel oxide layer 110 and is coated by the doping surface field 2. Due to the manufacturing process, the metal electrode 150 may penetrate the tunnel oxide layer 110 and be in contact with the substrate 100. In the embodiments of the present disclosure, the doping surface field 2 is disposed in the substrate 100, and the doping surface field 2 coats the metal electrode 150 disposed in the substrate 100, thereby having an interface passivation effect on the metal electrode 150 in the substrate 100, and reducing interface recombination between the metal electrode 150 and the substrate 100. However, since the metal electrode 150 penetrates to the substrate 100, carriers transmitted in the metal electrode 150 is able to be directly transmitted into the substrate 100 without passing through the tunnel oxide layer 110, thereby improving the transmission efficiency of carriers. Considering that the penetration of the metal electrode 150 through the tunnel oxide layer 110 may adversely affect the passivation performance of the tunnel oxide layer 110 while the carrier transmission efficiency is improved, the doping of nitrogen and phosphorus in the tunnel oxide layer 110 is further provided to increase the dielectric constant at the interface of the tunnel oxide layer 110 and improve the passivation effect of the tunnel oxide layer 110, thereby improving the reliability of the photovoltaic cell as a whole.

Figure 3:
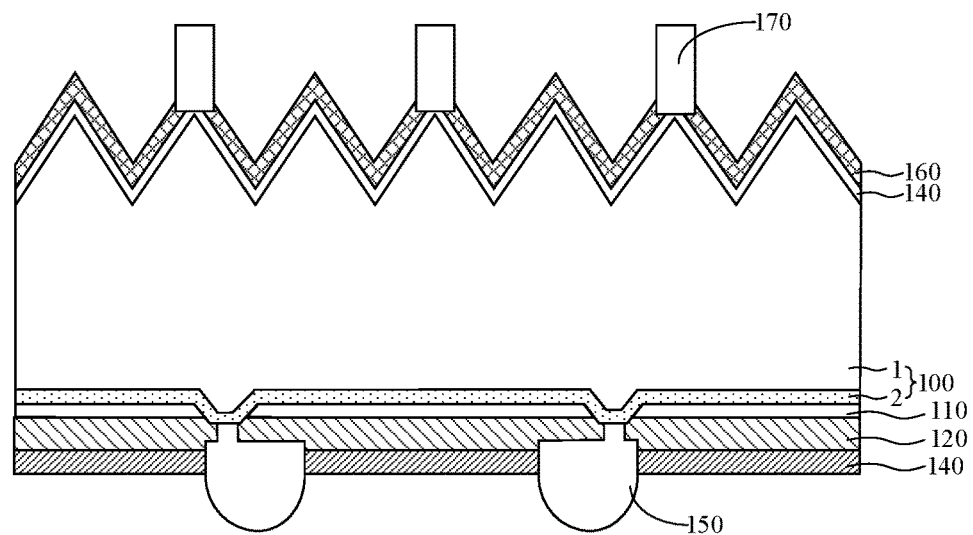
FIG. 3 is yet another schematic structural diagram of a photovoltaic cell according to an embodiment of the present disclosure.

FIG. 3 is yet another schematic structural diagram of a photovoltaic cell according to an embodiment of the present disclosure. Referring to FIG. 3, in some embodiments, at least a portion of a substrate 100 corresponding to the metal electrode 150 penetrates the tunnel oxide layer 110, and the doping surface field 2 disposed in the substrate 100 penetrating the tunnel oxide layer 110 is in contact with the metal electrode 150. That is, at least the portion of the metal electrode 150 is in direct contact with the substrate 100 so that the transmission of carriers by the metal electrode 150 is not limited by the tunnel oxide layer 110 and has a high transmission efficiency. Meanwhile, the doping surface field 2 in the substrate 100 is in contact with the metal electrode 150, which has a good passivation effect on the interface between the metal electrode 150 and the substrate 100, thereby reducing the recombination of carriers at a metal interface and increasing the open circuit voltage of the photovoltaic cell. Specifically, in some embodiments, a portion of the substrate 100 corresponding to the metal electrode 150 may be configured to penetrate the tunnel oxide layer 110 to be in contact with the metal electrode 150. In some embodiments, the whole substrate 100 corresponding to the metal electrode 150 may be configured to penetrate the tunnel oxide layer 110 to be in contact with the metal electrode 150.

Figure 4:
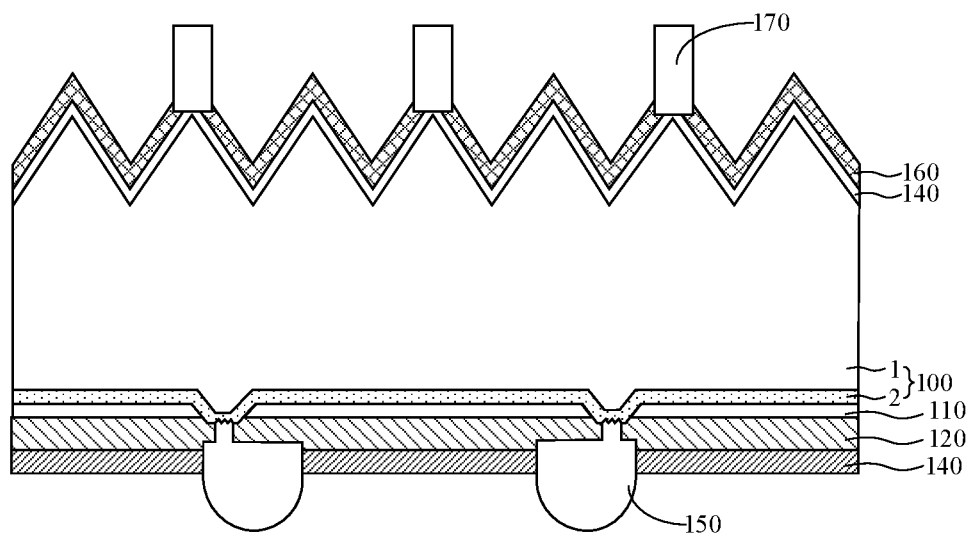
FIG. 4 is still another schematic structural diagram of a photovoltaic cell according to an embodiment of the present disclosure.

FIG. 4 is still another schematic structural diagram of a photovoltaic cell according to an embodiment of the present disclosure. Referring to FIG. 4, in some embodiments, the surface of the doping surface field 2 in contact with the metal electrode 150 is a concave-convex surface. The concave-convex surface has a large specific surface area, so that a contact area between the metal electrode 150 and the doping surface field 2 is large, thereby enhancing that the passivation effect of the doping surface field 2 on the metal electrode 150.

Specifically, in some embodiments, a width of the concave-convex surface may be less than a width of the metal electrode 150. Compared with the surface of the doping surface field 2 being planar, the surface where the doping surface field 2 is in contact with the metal electrode 150 being provided as the concave-convex surface makes the contact area between the doping surface field 2 and the metal electrode 150 increase. That is, the surface where the doping surface field 2 is in contact with the metal electrode 150 is provided as the concave-convex surface, so that a good passivation effect is able to be achieved when the concave-convex surface of the doping surface field 2 has a small width. Based on this, the width of the concave-convex surface is configured to be less than the width of the metal electrode 150, so that a volume of the metal electrode 150 penetrating into the tunnel oxide layer 110 is small, thereby reducing the adverse effect on the passivation effect of the tunnel oxide layer 110.

In some embodiments, the photovoltaic cell further includes a first passivation layer. The first passivation layer is disposed on a side of the doping conductive layer 120 away from the substrate 100 to enhance incident effect of incident light on the substrate 100, and also to enhance the passivation effect of the doping conductive layer 120 and the tunnel oxide layer 110. A material of the first passivation layer may be one or more of silicon oxide, aluminum oxide, silicon nitride, silicon oxynitride, or silicon oxycarbonitride. Specifically, in some embodiments, the first passivation layer may be a single layer structure. In some embodiments, the first passivation layer may also be a multilayer structure.

In some embodiments, the photovoltaic cell further includes an antireflection layer 160 disposed on a second surface. The antireflection layer 160 play a role of antireflecting the incident light, i.e., reducing the reflectivity of the substrate 100 to the incident light. In this way, the substrate 100 is able to absorb more incident light, so that utilization of sunlight is large, and photoelectric conversion performance of the photovoltaic cell is further improved.

In some embodiments, the antireflection layer 160 may be a silicon nitride layer, which may include a material of silicon nitride having a high refractive index such that more incident light enters the substrate 100, thereby increasing utilization of the incident light. In addition, silicon nitride has a good hydrogen passivation effect, so that the carrier concentration on the rear surface of the substrate 100 is increased, the carrier recombination is suppressed, and the open circuit voltage, the short circuit current and filling factors of the photovoltaic cell are increased. In some embodiments, the antireflection layer 160 may also be a multilayer structure, such as a stacked structure consisting of one or more materials of silicon nitride, silicon oxide, or silicon oxynitride.

In some embodiments, the photovoltaic cell further includes a second metal electrode 170 disposed on the second surface of the substrate 100 and penetrating the antireflection layer 160 to be electrically connected to the emitter.

In the photovoltaic cells provided in the above embodiments, the tunnel oxide layer 110 includes nitrogen and phosphorus to improve the overall passivation effect of the tunnel oxide layer 110, and even if the metal electrode 150 penetrates the tunnel oxide layer 110, the interface passivation performance of the penetrated tunnel oxide layer 110 is able to meet the requirement of the substrate 100. The doping surface field 2 is disposed in the substrate 100, which enhances the lateral transmission of most carriers and reduces the series resistance of the cell. Even if the metal electrode 150 penetrates the tunnel oxide layer 110 to be in direct contact with the substrate 100, the doping surface field 2 disposed in the substrate 100 may coats the metal electrode 150, thereby having a good interface passivation effect on the metal electrode 150 disposed in the substrate 100 and reducing interface recombination between the metal electrode 150 and the substrate 100. Furthermore, the doping concentration on the side of the doping surface field 2 facing the tunnel oxide layer 110 is configured to be greater than the doping concentration on the side of the doping surface field 2 away from the tunnel oxide layer 110, i.e., the doping concentration difference is provided in the doping surface field 2 so that carriers transmitted through the metal electrode 150 is able to be smoothly transmitted into the substrate 100, thereby increasing the transmission efficiency of the carriers. Therefore, even if the metal electrode 150 penetrates into the substrate 100, the photovoltaic cell is still able to maintain the good performance, thereby improving the reliability of the photovoltaic cell.

Figure 5:
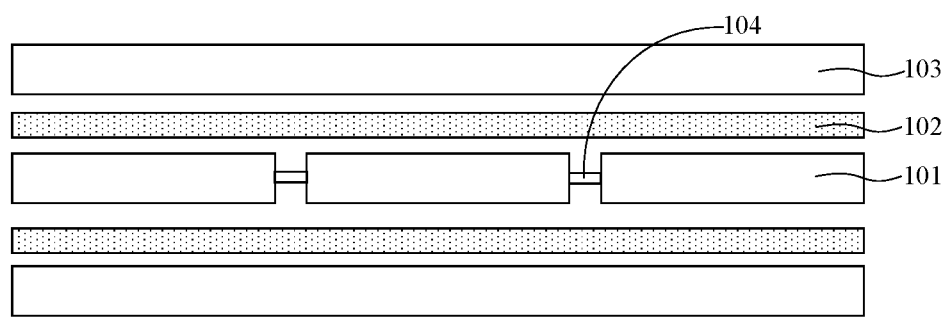
FIG. 5 is a schematic structural diagram of a photovoltaic module according to an embodiment of the present disclosure.

Embodiments of the present disclosure further provides a photovoltaic module. Referring to FIG. 5, the photovoltaic module includes a cell string, an encapsulation layer 102, and a cover plate 103. The cell string includes a plurality of photovoltaic cells electrically connected, each of which may be the photovoltaic cell according to the above embodiments. The encapsulation layer 102 is configured to cover a surface of the cell string. The cover plate 103 is configured to cover a surface of the encapsulation layer 102 away from the cell string. The photovoltaic cells 101 are electrically connected in whole or in pieces to form a plurality of cell strings, and the plurality of cell strings are electrically connected in series and/or in parallel.

Specifically, in some embodiments, the plurality of cell strings may be electrically connected to each other by a plurality of conductive tapes 104. The encapsulation layer 102 covers a front surface and a rear surface of the photovoltaic cell 101. Specifically, the encapsulation layer 102 may be an organic encapsulation adhesive film such as an ethylene-vinyl acetate (EVA) adhesive film, a polyolefin elastomer (POE) adhesive film, a polyethylene terephthalate (PET) adhesive film, etc. In some embodiments, the cover plate 103 may be a glass cover plate, a plastic cover plate, or the like having a light transmitting function. Specifically, a surface of the cover plate 103 toward the encapsulation layer 102 may be a concave-convex surface, thereby increasing utilization of incident light.

Embodiments of the present disclosure further provides a method for manufacturing a photovoltaic cell. The method for manufacturing a photovoltaic cell is able to form the photovoltaic cell provided in the above embodiments. The following describes the method for manufacturing the photovoltaic cell provided in the embodiments of the present disclosure in detail with reference to the accompanying drawings.

FIGS. 6 to 11 are schematic structural diagrams of corresponding operations in a method for manufacturing a photovoltaic cell according to some embodiments of the present disclosure.

Figure 6:
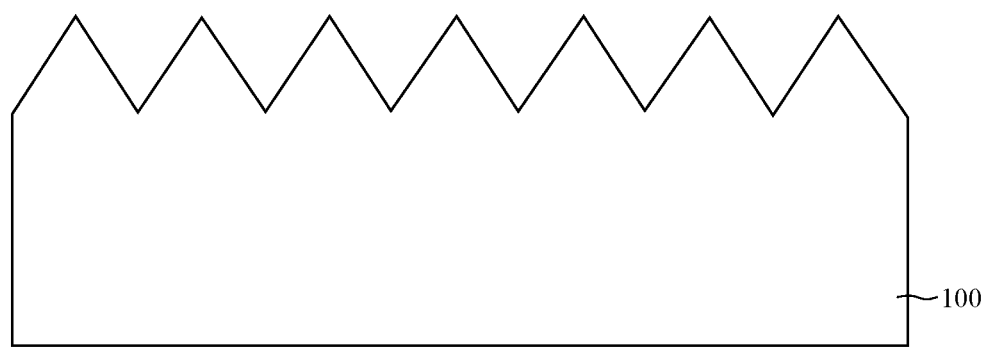
FIG. 6 is a schematic structural diagram of a substrate provided in a method for manufacturing a photovoltaic cell according to an embodiment of the present disclosure.

FIG. 6 is a schematic structural diagram of a substrate 100 provided in a method for manufacturing a photovoltaic cell according to an embodiment of the present disclosure.

The substrate 100 is configured to receive incident light and generate photogenerated carriers. In some embodiments, the substrate 100 may be a silicon substrate 100, and a material of the silicon substrate 100 may include single crystal silicon, polysilicon, amorphous silicon, or microcrystalline silicon. In some embodiments, a material of the substrate 100 may also include elemental carbon, an organic material, or a multinary-compound. The multinary-compound includes gallium arsenide, cadmium telluride, copper indium selenium, etc.

Figure 7:
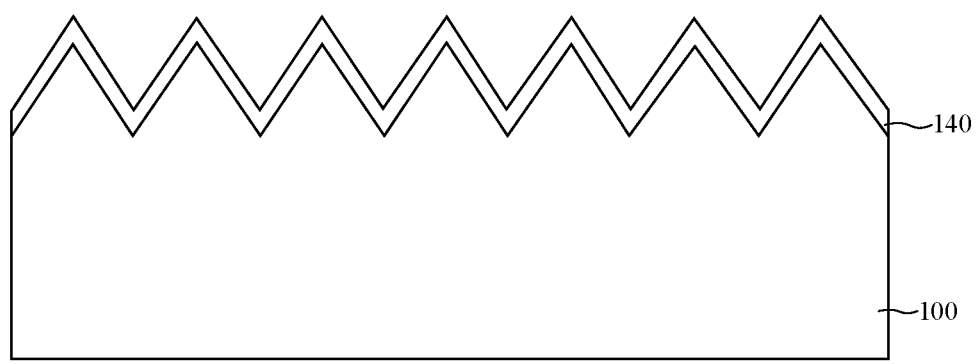
FIG. 7 is a schematic structural diagram corresponding to an operation of forming an emitter in a method for manufacturing a photovoltaic cell according to an embodiment of the present disclosure.
Figure 8:
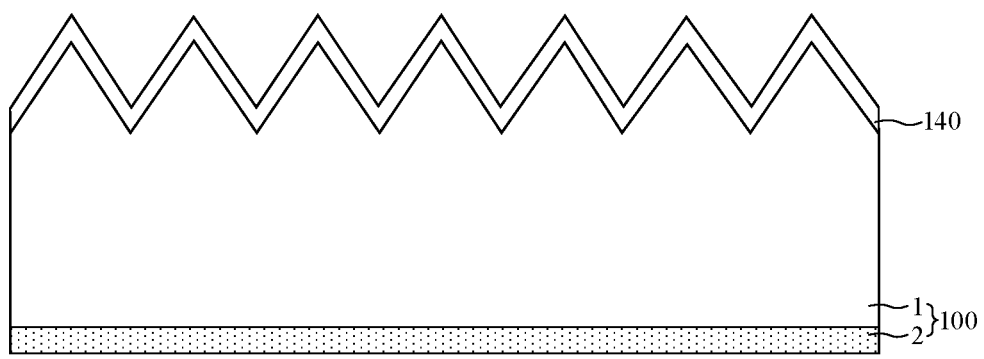
FIG. 8 is a schematic structural diagram corresponding to an operation of forming a doping surface field in a method for manufacturing a photovoltaic cell according to an embodiment of the present disclosure.
Figure 9:
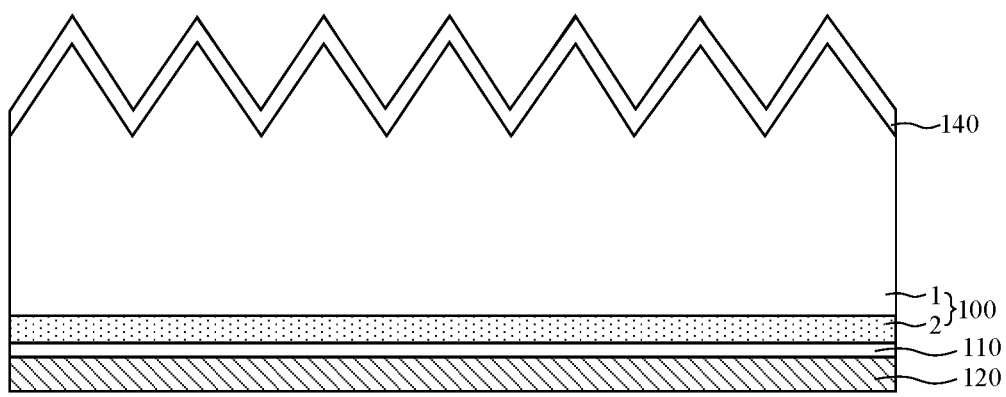
FIG. 9 is a schematic structural diagram corresponding to an operation of forming a tunnel oxide layer and a doping conductive layer in a method for manufacturing a photovoltaic cell according to an embodiment of the present disclosure.

Referring to FIGS. 7 to 9, a tunnel oxide layer 110 and a doping conductive layer 120 are sequentially formed on a first surface of the substrate 100 and in a direction away from the substrate 100. The tunnel oxide layer 110 includes nitrogen and phosphorus. A doping surface field 2 is formed, the doping surface field 2 is disposed in the substrate 100, and the doping surface field 2 is in contact with a side of the tunnel oxide layer 110 facing the substrate 100, the doping surface field 2 includes a doping element of the same conductivity type as a doping element included in the substrate 100, and a doping concentration on a side of the doping surface field 2 facing the tunnel oxide layer 110 is greater than a doping concentration on a side of the doping surface field 2 away from the tunnel oxide layer 110. The doping surface field 2 is configured to include a doping element of the same conductivity type as a doping element included in the substrate 100 to enhance the lateral transmission of most carriers and reduce the series resistance of the cell. In this way, even if the metal electrode 150 penetrates the tunnel oxide layer 110 to be in direct contact with the substrate 100, the doping surface field 2 disposed in the substrate 100 may coat the metal electrode 150, thereby having a good interface passivation effect on the metal electrode 150 disposed in the substrate 100 and reducing interface recombination between the metal electrode 150 and the substrate 100. Furthermore, the doping concentration on the side of the doping surface field 2 facing the tunnel oxide layer 110 is configured to be greater than the doping concentration on the side of the doping surface field 2 away from the tunnel oxide layer 110, i.e., the doping concentration difference is provided in the doping surface field 2 so that carriers transmitted through the metal electrode 150 is able to be smoothly transmitted into the substrate 100, thereby increasing the transmission efficiency of the carriers.

Specifically, in some embodiments, the doping surface field 2 may be formed before forming the tunnel oxide layer 110 and the doping the conductive layer 120, and the operation of forming the doping surface field 2 includes the following operations.

The substrate 100 is doped, and the substrate 100 has first doping ions. In some embodiments, the photovoltaic cell may be an TOPCON cell, and the substrate 100 is an N-type semiconductor substrate 100, i.e., the first doping ions are N-type doping ions, and the N-type doping ions may be any of phosphorus ions, arsenic ions, or antimony ions.

Referring to FIG. 7, FIG. 7 is a schematic structural diagram corresponding to an operation of forming an emitter in a method for manufacturing a photovoltaic cell according to an embodiment of the present disclosure. As shown in FIG. 7, an emitter is formed. In some embodiments, the substrate 100 is an N-type semiconductor substrate 100, and the emitter may be a P-type emitter. Specifically, a specific process for forming the emitter may be to perform a boron diffusion treatment on the first surface of the substrate 100 to form the emitter, and the emitter and the N-type substrate 100 form a PN junction of the photovoltaic cell.

Referring to FIG. 8, FIG. 8 is a schematic structural diagram corresponding to an operation of forming a doping surface field 2 in a method for manufacturing a photovoltaic cell according to an embodiment of the present disclosure. A diffusion treatment is performed on the first surface of the substrate 100 to form the doping surface field 2, the doping surface field 2 has second doping ions, the first doping ions and the second doping ions have the same conductivity type, and a doping concentration of the first doping ions is less than a doping concentration of the second doping ions. In some embodiments, when the first doping ions are N-type doping ions, the second doping ions are also N-type doping ions, for example, any of phosphorus ions, arsenic ions or antimony ions. Taking the N-type doping ions being the phosphorus ions as an example, a phosphorus diffusion treatment is performed on the first surface of the substrate 100 to form an N-type doping layer on the first surface of the substrate 100. Specifically, in some embodiments, phosphorus ions may be implanted into the first surface of the substrate 100 by ion implantation, thermal diffusion, laser doping, etc.

In some embodiments, after the phosphorus diffusion treatment is completed, it is also necessary to remove a phosphosilicate glass on the first surface of the substrate 100, so that a thickness of the tunnel oxide layer 110 is uniform when subsequently forming the tunnel oxide layer 110 on the first surface of the substrate 100, which is conducive to improving the interface passivation effect of the tunnel oxide layer 110 on the substrate 100.

In order to ensure that the doping concentration on the side of the doping surface field 2 facing the tunnel oxide layer 110 is greater than the doping concentration on the side of the doping surface field 2 away from the tunnel oxide layer 110, in some embodiments, a concentration of the phosphorus ions implanted into the first surface of the substrate 100 may be low at an initial stage of the phosphorus diffusion treatment and high at a later stage of the phosphorus diffusion treatment.

Specifically, in some embodiments, a doping concentration of the first doping ions may be in a range of $1\times10^{16}$ atoms/cm$^3$ to $1\times10^{17}$ atoms/cm$^3$, and a doping concentration of the second doping ions may be in a range of $1\times10^{19}$ atoms/cm$^3$ to $9\times10^{20}$ atoms/cm$^3$. The doping concentration of the first doping ions is much less than the doping concentration of the second doping ions. In this way, a formed doping concentration difference between the doping surface field 2 and the substrate 100 is large, so that the doping surface field 2 is able to form a heavily doped region and form a high-low junction with the substrate 100. When the metal electrode 150 penetrates the tunnel oxide layer 110 to the substrate 100 subsequently, the carrier recombination at the interface between the metal electrode 150 and the substrate 100 is reduced, thereby enhancing the carrier transmission capability. In addition, the doping surface field 2 formed in this range has a good passivation effect on the metal interface, so that the photovoltaic cell is able to maintain a good photoelectric performance when the metal electrode 150 penetrates into the substrate 100, thereby improving the reliability of the photovoltaic cell.

Referring to FIG. 9, FIG. 9 is a schematic structural diagram corresponding to an operation of forming a tunnel oxide layer 110 and a doping conductive layer 120 in a method for manufacturing a photovoltaic cell according to an embodiment of the present disclosure. In some embodiments, the tunnel oxide layer 110 and the doping conductive layer 120 are formed after the doping surface field 2 is formed, and the operation of forming the tunnel oxide layer 110 and the doping conductive layer 120 includes the following operations.

The tunnel oxide layer 110 is formed on the surface of the doping surface field 2 by an oxidation treatment. The tunnel oxide layer 110 includes nitrogen and phosphorus, the doping of nitrogen is able to increase the dielectric constant of the interface of the tunnel oxide layer 110, improve the passivation effect, and raise the open circuit voltage. The doping of phosphorus is able to increase the tunneling current of electrons, reduce the internal resistance of the cell, thereby improving the overall passivation effect of the tunnel oxide layer 110. Even if the metal electrode 150 penetrates into the substrate 100, the good passivation performance of the tunnel oxide layer 110 is still able to be maintained.

In some embodiments, the operation of forming the tunnel oxide layer 110 including nitrogen and phosphorus includes the following operations.

Thermal oxidation is performed on the first surface of the substrate 100 to form an initial oxide layer.

Phosphorus diffusion is performed on the initial oxide layer to form a first oxide layer including phosphorus. Specifically, a phosphorus source may be used as a doping source, $O_2$ with a flow rate of 10 L/min to 12 L/min is inlet, and the introduction time is in a range of 3 min to 5 min. After the introduction is stopped, the phosphorus diffusion is performed on the initial oxide layer once, a temperature of the phosphorus diffusion for one time is in a range of 780° C. to 820° C., and the time for the phosphorus diffusion for one time is in a range of 50 s to 60 s. In some embodiments, an in-situ doping method may be used to simultaneously perform oxidation and phosphorus diffusion treatments, and the oxidation treatment may be any of an ozone oxidation method, a high-temperature thermal oxidation method, and a nitric acid oxidation method. In some embodiments, the phosphorus source is $POCl_3$ or $PH_3$, the flow rate of $O_2$ is in a range of 10 L/min to 12 L/min, the introduction time is in a range of 3 min to 5 min, a temperature of the phosphorus diffusion for one time is in a range of 780° C. to 820° C., and the time for the phosphorus diffusion for one time is in a range of 50 s to 60 s.

Nitrogen doping is performed on the first oxide layer to form the tunnel oxide layer 110. Specifically, the oxidation of the first oxide layer is continued at a temperature of 500° C. to 530° C. A mixed gas of $O_2$ and $N_2O$ with a volume ratio of (2~4):1 is used as the doping source, the flow rate of the mixed gas is in a range of 8 L/min to 10 L/min, the introduction time is in a range of 3 min to 5 min, and nitrogen diffusion is performed on the oxidized product after the introduction was stopped, a temperature of the nitrogen diffusion is in a range of 500° C. to 530° C., and the time for the nitrogen diffusion is in a range of 40 s to 60 s.

An initial conductive layer is deposited on the surface of the tunnel oxide layer 110. The initial conductive layer may be formed on the surface of the tunnel oxide layer 110 by a deposition treatment. Specifically, an intrinsic polysilicon may be deposited on the surface of the tunnel oxide layer 110 to form the initial conductive layer by the deposition treatment.

A diffusion treatment is performed on the initial conductive layer to form the doping conductive layer 120, the doping conductive layer 120 has third doped ions, the third doped ions have the same conductivity type as the second doped ions, and a doping concentration of the third doped ions is greater than the doping concentration of the second doped ions. The doping concentration of the doping surface field 120 is configured to be less than the doping concentration of the doping conductive layer 120, so that a concentration difference from high to low is formed in a direction along the doping conductive field 2 toward the substrate 100. Since the doping conductive layer 120 also plays a role of transmitting carriers, the carrier concentration of the doping conductive layer 120 is configured to be high, which facilitates the carriers in the doping conductive layer 120 to be transmitted from the doping conductive layer 120 with a higher doping concentration to the doping surface field 2 with a lower doping concentration, thereby accelerating the transmission rate of the carriers and increasing the open circuit voltage of the photovoltaic cell. In some embodiments, when the second doping ions are phosphorus ions, the third doping ions may be phosphorus ions, and the phosphorus ions may be implanted into the first surface of the substrate 100 by ion implantation, thermal diffusion, laser doping or the like to form an N-type doped polysilicon layer as the doping conductive layer 120.

Specifically, in some embodiments, the doping concentration of the third doping ions may be in a range of 1 atoms/cm$^3$ to $1\times10^{20}$ atoms/cm$^3$. In this range, the doping concentration of the doping conductive layer 120 is greater than the doping concentration of the doping surface field 2, so that a large concentration difference is formed between the doping surface field 2 and the first region 1 of the substrate 100, thereby forming a heavily doped region. In addition, the doping concentration of the doping conductive layer 120 formed in this range is able to ensure that the doping conductive layer 120 has a high transmission rate of the carriers.

Figure 10:
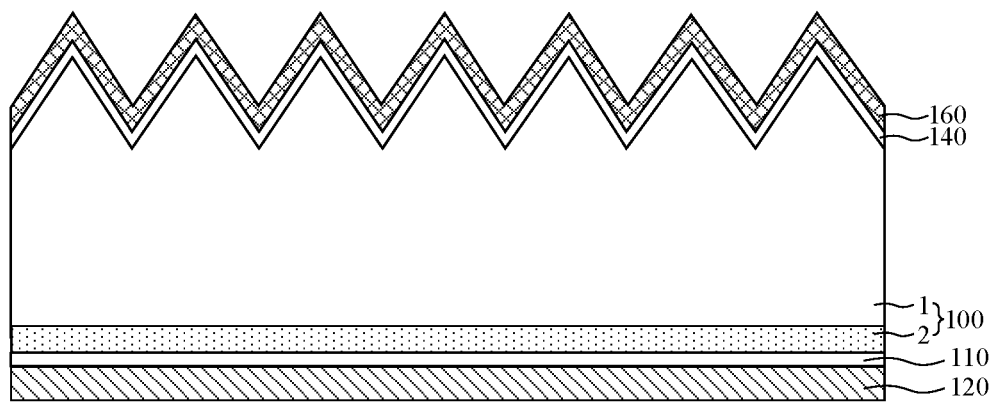
FIG. 10 is a schematic structural diagram corresponding to an operation of forming an antireflection layer in a method for manufacturing a photovoltaic cell according to an embodiment of the present disclosure.

Referring to FIG. 10, FIG. 10 is a schematic structural diagram corresponding to an operation of forming an antireflection layer 160 in a method for manufacturing a photovoltaic cell according to an embodiment of the present disclosure. The antireflection layer 160 is formed on a second surface of the substrate 100. In some embodiments, the antireflection layer 160 may be a silicon nitride layer including a material of silicon nitride. Specifically, in some embodiments, a plasma enhanced chemical vapor deposition (PECVD) method may be used to form the antireflection layer 160, and specifically, a process method for forming the antireflection layer 160 includes introducing silane and ammonia gas into a PECVD reaction chamber and performing ionization to form the antireflection layer 160 on the second surface of the substrate 100.

Figure 11:
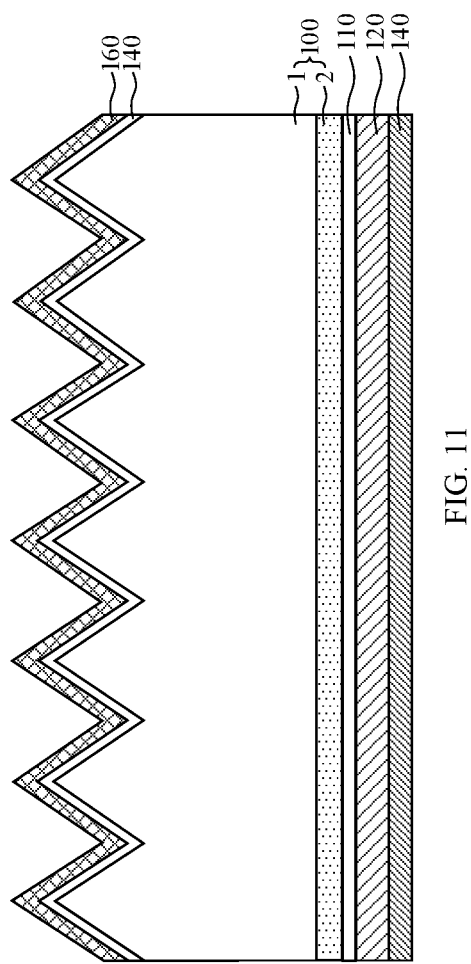
FIG. 11 is a schematic structural diagram corresponding to an operation of forming a first passivation layer in a method for manufacturing a photovoltaic cell according to an embodiment of the present disclosure.

Referring to FIG. 11, FIG. 11 is a schematic structural diagram corresponding to an operation of forming a first passivation layer in a method for manufacturing a photovoltaic cell according to an embodiment of the present disclosure. The first passivation layer is formed on a surface of the doping conductive layer 120 away from the substrate 100. In some embodiments, a material of the first passivation layer may be one or more of silicon oxide, aluminum oxide, silicon nitride, silicon oxynitride, or silicon oxynitride. Specifically, in some embodiments, the first passivation layer may be a single layer structure. In some embodiments, the first passivation layer may also be a multilayer structure. Specifically, in some embodiments, the first passivation layer may be formed using the PECVD method.

Referring to FIG. 1, the metal electrode 150 is formed, and the metal electrode 150 is electrically connected to the doping conductive layer 120. A conductive paste is printed on the metal electrode 150, and the conductive paste is sintered to form the metal electrode 150. In some embodiments, the conductive paste may be printed on the metal electrode 150 on the first surface by screen printing, and then the conductive paste may be subjected to a high-temperature sintering treatment, for example, a 750° C. to 850° C. peak temperature sintering treatment may be used to form the metal electrode 150. In some embodiments, a conductive material in the conductive paste may include at least one of silver, aluminum, copper, tin, gold, lead, or nickel. Since the doping surface field 2 is formed in the substrate 100, even if the metal electrode 150 penetrates the substrate 100 during the process of manufacturing the metal electrode 150, the doping surface field 2 is still able to coat the metal electrode 150 and produce a good interface passivation effect at a contact surface of the metal electrode 150 and the substrate 100, thereby ensuring the reliability of the photovoltaic cell. That is, the photovoltaic cell has good performance regardless of whether the metal electrode 150 penetrates the substrate 100 or not, so that the process window for manufacturing the metal electrode 150 is enlarged, and the process efficiency is improved.

In some embodiments, the method further includes forming a second metal electrode 170 on a surface of the antireflection layer 160, and the second metal electrode 170 penetrates the antireflection layer 160 to be electrically connected to the emitter. The operation of forming the second metal electrode 170 includes metallizing the surface of the antireflection layer 160 through a screen printing treatment and a high-temperature sintering treatment to form the second metal electrode 170 electrically connected to the emitter.

In the method for manufacturing the photovoltaic cell provided in the above embodiments, the tunnel oxide layer 110 is formed to include nitrogen and phosphorus so as to improve the overall passivation effect of the tunnel oxide layer 110. Even if the metal electrode 150 penetrates the tunnel oxide layer 110, the tunnel oxide layer 110 is still able to meet the passivation requirement of the substrate 100. The doping surface field 2 is formed in the substrate 100, and the doping element of the doping surface field 2 has the same conductivity type as the doping element of the substrate 100, which enhances the lateral transmission of most carriers and reduces the series resistance of the cell. In this way, even if the metal electrode 150 penetrates the tunnel oxide layer 110 to be in direct contact with the substrate 100, the doping surface field 2 disposed in the substrate 100 may coat the metal electrode 150, thereby having a good interface passivation effect on the metal electrode 150 disposed in the substrate 100, and reducing interface recombination between the metal electrode 150 and the substrate 100. Furthermore, the doping concentration on the side of the doping surface field 2 facing the tunnel oxide layer 110 is configured to be greater than the doping concentration on the side of the doping surface field 2 away from the tunnel oxide layer 110, i.e., the doping concentration difference is provided in the doping surface field 2 so that carriers transmitted through the metal electrode 150 is able to be smoothly transmitted into the substrate 100, thereby increasing the transmission efficiency of the carriers. Therefore, even if the metal electrode 150 penetrates into the substrate 100, the photovoltaic cell is still able to maintain the good performance, thereby improving the reliability of the photovoltaic cell.

Although disclosed above in some embodiments, the present disclosure is not intended to limit the claims. Any one of those skilled in the art may make several possible changes and modifications without departing from the concept of the present disclosure. Therefore, the protection scope of the present disclosure shall be subject to the scope defined in the claims of the present disclosure.

Those of ordinary skill in the art should appreciate that the embodiments described above are specific embodiments of the present disclosure, and in practical application, various changes may be made thereto in form and detail without departing from the scope of the present disclosure. Any one of those skilled in the art may make their own changes and modifications without departing from the scope of the present disclosure. Therefore, the protection scope of the present disclosure shall be subject to the scope defined in the claims.

What is claimed is:

1. A photovoltaic cell, comprising:
   a substrate;
   a tunnel oxide layer and a doping conductive layer sequentially disposed on a first surface of the substrate in a direction away from the substrate, wherein the tunnel oxide layer includes a silicon oxide material and is doped with nitrogen and phosphorus, wherein a ratio of nitrogen content in the tunnel oxide layer to oxygen content plus the nitrogen content in the tunnel oxide layer is less than 15%, and doping concentration of the phosphorus in the tunnel oxide layer is in a range of $1\times10^{10}/cm^3$ to $1\times10^{18}/cm^3$;

a doping surface field disposed in the substrate, wherein the doping surface field is in contact with a side of the tunnel oxide layer facing the substrate, the doping surface field includes a doping element of a same conductivity type as a doping element in the substrate, and wherein, in the doping surface field, a doping concentration on a side of the doping surface field facing the tunnel oxide layer is greater than a doping concentration on a side of the doping surface field away from the tunnel oxide layer, wherein the doping surface field and the doping conductive layer have doping ions of a same conductivity type, and doping concentration of the doping surface field is less than doping concentration of the doping conductive layer, and wherein a thickness of the doping surface field is in a range of 20 nm to 60 nm in a direction from the tunnel oxide layer toward the substrate; and a metal electrode electrically connected to the doping conductive layer.

2. The photovoltaic cell according to claim 1, wherein the substrate includes a first region, wherein the first region includes a region of the substrate except for the doping surface field, and the doping concentration of the doping surface field is greater than a doping concentration of the first region.

3. The photovoltaic cell according to claim 2, wherein a ratio of the doping concentration of the first region to the doping concentration of the doping surface field is in a range of 1:10000 to 1:1000.

4. The photovoltaic cell according to claim 2, wherein a ratio of the doping concentration of the doping surface field to the doping concentration of the doping conductive layer is in a range of 1:100 to 1:10.

5. The photovoltaic cell according to claim 1, wherein, in the doping surface field, a ratio of the doping concentration on the side of the doping surface field facing away from the tunnel oxide layer to the doping concentration on the side of the doping surface field facing the tunnel oxide layer is in a range of 1:1000 to 1:10.

6. The photovoltaic cell according to claim 5, wherein a doping concentration of the doping surface field gradually decreases in a direction-along from the tunnel oxide layer toward the substrate.

7. The photovoltaic cell according to claim 1, wherein at least a portion of the metal electrode penetrates the tunnel oxide layer and is coated by the doping surface field.

8. The photovoltaic cell according to claim 1, wherein at least a portion of the substrate corresponding to the metal electrode penetrates the tunnel oxide layer, and the doping surface field disposed in the substrate penetrating the tunnel oxide layer is in contact with the metal electrode.

9. The photovoltaic cell according to claim 8, wherein a surface of the doping surface field in contact with the metal electrode includes a concave-convex surface.

10. The photovoltaic cell according to claim 9, wherein a width of the concave-convex surface is less than a width of the metal electrode.

11. A photovoltaic module, comprising:
a cell string including a plurality of photovoltaic cells electrically connected;
an encapsulation layer configured to cover a surface of the cell string; and
a cover plate configured to cover a surface of the encapsulation layer away from the cell string;
wherein each of the plurality of photovoltaic cells includes:
a substrate;
a tunnel oxide layer and a doping conductive layer sequentially disposed on a first surface of the substrate in a direction away from the substrate, wherein the tunnel oxide layer includes a silicon oxide material and is doped with nitrogen and phosphorus, wherein a ratio of nitrogen content in the tunnel oxide layer to oxygen content plus the nitrogen content in the tunnel oxide layer is less than 15%, and doping concentration of the phosphorus in the tunnel oxide layer is in a range of $1\times10^{10}/cm^3$ to $1\times10^{18}/cm^3$,
a doping surface field disposed in the substrate, wherein the doping surface field is in contact with a side of the tunnel oxide layer facing the substrate, the doping surface field includes a doping element of a same conductivity type as a doping element in the substrate, and wherein, in the doping surface field, a doping concentration on a side of the doping surface field facing the tunnel oxide layer is greater than a doping concentration on a side of the doping surface field away from the tunnel oxide layer, wherein the doping surface field and the doping conductive layer have doping ions of a same conductivity type, and the doping concentration of the doping surface field is less than doping concentration of the doping conductive layer, and wherein a thickness of the doping surface field is in a range of 20 nm to 60 nm in a direction from the tunnel oxide layer toward the substrate; and
a metal electrode electrically connected to the doping conductive layer.

12. The photovoltaic module according to claim 11, wherein the substrate includes a first region, wherein the first region includes a region of the substrate except for the doping surface field, and the doping concentration of the doping surface field is greater than a doping concentration of the first region.

13. The photovoltaic module according to claim 12, wherein a ratio of the doping concentration of the first region to the doping concentration of the doping surface field is in a range of 1:10000 to 1:1000.

14. The photovoltaic module according to claim 12, wherein a ratio of the doping concentration of the doping surface field to the doping concentration of the doping conductive layer is in a range of 1:100 to 1:10.

15. The photovoltaic module according to claim 11, wherein, in the doping surface field, a ratio of the doping concentration on the side of the doping surface field facing away from the tunnel oxide layer to the doping concentration on the side of the doping surface field facing the tunnel oxide layer is in a range of 1:1000 to 1:10.

16. The photovoltaic module according to claim 15, wherein a doping concentration of the doping surface field gradually decreases in a direction from the tunnel oxide layer toward the substrate.

17. The photovoltaic module according to claim 11, wherein at least a portion of the metal electrode penetrates the tunnel oxide layer and is coated by the doping surface field.

* * * * *